(12) United States Patent
Akikuni et al.

(10) Patent No.: US 6,469,528 B2
(45) Date of Patent: *Oct. 22, 2002

(54) ELECTRO-OPTIC SAMPLING PROBE AND MEASURING METHOD USING THE SAME

(75) Inventors: Fumio Akikuni, Tokyo (JP); Katsushi Ohta, Tokyo (JP); Mitsuru Shinagawa, Isehara (JP); Tadao Nagatsuma, Sagamihara (JP); Junzo Yamada, Ebina (JP)

(73) Assignees: Ando Electric Co., Ltd., Tokyo (JP); Nippon Telegraph and Telephone Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 24 days.

(21) Appl. No.: 09/452,295

(22) Filed: Nov. 30, 1999

(65) Prior Publication Data

US 2002/0030500 A1 Mar. 14, 2002

(30) Foreign Application Priority Data

Nov. 30, 1998 (JP) ............................................. 10-340824

(51) Int. Cl.$^7$ ................................................ G01R 31/00
(52) U.S. Cl. .................. 324/752; 324/158.1; 250/492.2
(58) Field of Search ................................. 324/751, 752, 324/158.1, 753; 250/492.1, 492.2, 310; 356/369; 438/8; 156/345

(56) References Cited

U.S. PATENT DOCUMENTS

| | | | | |
|---|---|---|---|---|
| 4,943,769 A | * | 7/1990 | Golladay et al. | 324/158.1 |
| 5,057,773 A | * | 10/1991 | Golladay et al. | 324/158.1 |
| 5,416,562 A | * | 5/1995 | Ota et al. | 355/53 |
| 5,493,236 A | * | 2/1996 | Ishii et al. | 324/752 |
| 5,661,548 A | * | 8/1997 | Imai | 355/55 |

* cited by examiner

Primary Examiner—Michael Sherry
Assistant Examiner—Jimmy Nguyen
(74) Attorney, Agent, or Firm—Blakely Sokoloff Taylor & Zafman

(57) ABSTRACT

An electro-optic sampling probe is disclosed, by which both faces of an IC wafer can be measured without moving the IC wafer. In the probe, an excitation optical system is provided at the back face side of a back-face excitation type IC wafer. The back face of the IC wafer is irradiated by light output from the excitation optical system, and simultaneously, the electric signal transmitted through wiring on the IC wafer is measured by using light output from an electro-optic sampling optical system provided at the front face side of the IC wafer. If the excitation optical system is substituted with an electro-optic sampling optical system, an IC wafer having wiring in both faces can also be measured.

10 Claims, 4 Drawing Sheets

ELECTRO-OPTIC SAMPLING PROBE AND MEASURING METHOD USING THE SAME

BACKGROUND OF THE INVENTION

1. Field of the Invention

The present invention relates to an electro-optic sampling probe (or prober) in which an electric field generated due to a target signal to be measured is applied to an electro-optic crystal, and an optical pulse signal generated based on a timing signal is incident onto the electro-optic crystal, and the waveform of the target signal is observed according to the polarization state of the incident optical pulse signal. In particular, the present invention relates to an electro-optic sampling probe whose optical system is revised and improved.

This application is based on Patent Application No. Hei 10-340824 filed in Japan, the contents of which are incorporated herein by reference.

2. Description of the Related Art

In a conventional technique, the waveform of a target signal (to be measured) can be observed by applying an electric field generated due to the target signal to an electro-optic crystal, inputting a laser beam to the electro-optic crystal, and observing the waveform of the target signal according to the polarization state of the laser beam. If a laser beam transformed into a pulse form is used for sampling the target signal, the measurement can be performed with a very high temporal resolution. The electro-optic sampling probe (abbreviated to "EOS probe", hereinbelow) employs an electro-optic probe having the above function.

In comparison with the conventional probes employing known electric probes, the above EOS probe has the following characteristics and thus has received widespread notice:

(1) The ground line is unnecessary for measuring the signal.

(2) The tip of the electro-optic probe is insulated from the circuit; thus, a high input impedance can be obtained and (the state of) the point to be measured is hardly disturbed.

(3) An optical pulse signal is used; thus, wide-band measurement of a GHz order can be performed.

(4) An electro-optic crystal can be made to contact a wafer of an IC (or the like), and a laser beam is converged on the wiring printed on the IC wafer, thereby enabling the measurement of thin wiring which a metallic pin cannot physically contact.

The structure of a conventional EOS probe will be explained with reference to FIG. 4. In FIG. 4, reference numeral 1 indicates an IC wafer connected to an external device via a power supply line and a signal line. Reference numeral 2 indicates an electro-optic element using an electro-optic crystal. Reference numeral 31 indicates an objective used for converging the beam incident on the electro-optic element 2. Reference numeral 41 indicates the (main) body of the probe, comprising a dichroic mirror 41a and a half mirror 41b. Reference numeral 6a indicates an EOS optical system module (called "EOS optical system", hereinbelow), to one end of which a fiber collimator 69 is attached. The EOS optical system 6a comprises a photodiode, a polarized beam splitter, a wave plate, and so on.

Reference numeral 7 indicates a halogen lamp for irradiating IC wafer 1 to be measured. Reference numeral 8 indicates an infrared camera (abbreviated to "IR camera", hereinbelow) for confirming the positioning for converging a beam onto a target wiring provided on the IC wafer 1. Reference numeral 9 indicates a suction stage for fixing the IC wafer 1, which can be finely moved in the x, y, and z directions. Reference numeral 10 indicates a surface plate (only a portion shown here) to which the suction stage 9 is attached. Reference numeral 11 indicates an optical fiber for transmitting a laser beam emitted from an external device.

Below, with reference to FIG. 4, the optical path of the laser beam from an external device will be explained. In the figure, the optical path of the laser beam inside the probe body 41 is indicated by reference symbol A.

The laser beam incident via optical fiber 11 on EOS optical system 6a is collimated by fiber collimator 69, and linearly progresses in the EOS optical system 6a and is input into probe body 41. The input beam further progresses straight inside the probe body 41, and is then deflected by 90 degrees by dichroic mirror 41a and then converged by objective 31 onto the electro-optic element 2 disposed on the wiring on the IC wafer 1. Here, the beam is converged onto the face (of the electro-optic element 2) which faces the IC wafer 1.

The wavelength of the laser beam incident via optical fiber 11 on the EOS optical system is 1550 nm. On the other hand, the dichroic mirror 41a has the characteristic of transmitting 5% (and reflecting 95%) of the beam having a wavelength of 1550 nm. Therefore, 95% of the beam emitted from the laser source is reflected and deflected by 90 degrees.

A dielectric mirror is deposited on the face of the electro-optic element 2, which aces the IC wafer 1. The laser beam reflected by this face is again collimated by objective 31 and returns to the EOS optical system 6a through the same path, and is incident on a photodiode (not shown) in the EOS optical system 6a.

Hereinbelow, the operation of positioning the IC wafer 1 by using the halogen lamp 7 and IR camera 8 will be explained. Here, the optical path of the beam emitted from the halogen lamp 7 and the positioning operation will be explained. In FIG. 4, the optical path of the beam emitted from the halogen lamp 7 is indicated by reference symbol B.

The halogen lamp 7 used here emits a light beam having a wavelength range from 400 nm to 1650 nm. The light beam emitted from the halogen lamp 7 is deflected by 90 degrees by half mirror 41b and progresses straight through the dichroic mirror 41a, so that the IC wafer 1 is irradiated by the light beam. In the half mirror 41b used here, the light intensities of the reflected and transmitted beams are the same.

The image of a portion of the IC wafer 1 irradiated by the halogen lamp 7, observed in the field of view of the objective 31, is picked up by the IR camera 8. This IR image is then displayed in monitor 8a. The operator finely moves and adjusts the suction stage 9 while observing the image displayed in monitor 8a, so as to position a target wiring portion (on the IC wafer 1, to be measured) inside the field of view.

The laser beam incident via optical fiber 11 on the EOS optical system 6a is reflected at the face of the electro-optic element 2 positioned on the wiring of IC wafer 1, and is further transmitted through the dichroic mirror 41a. This transmitted beam is confirmed by the operator by observing the image of IR camera 8, and thereby adjusting the suction stage 9 or probe body 41 so as to converge the laser beam at a point on the face of the electro-optic element 2 positioned on the target wiring portion to be measured. Here, the dichroic mirror 41a has a characteristic of transmitting 5% of (the wavelength range of) the laser beam; thus, this laser beam can be confirmed using the IR camera 8.

Below, the operation of measuring a target signal (to be measured) using the EOS probe (shown in FIG. 4) will be explained.

When a voltage is applied to the target wiring on the IC wafer 1, the corresponding electric field is applied to the electro-optic element 2, and the refractive index thereof is then changed due to the Pockèls effect. As explained above, the laser beam is incident on the electro-optic element 2, and is reflected by the face which faces the IC wafer 1 and returned through the same optical path. According to the above effect, the polarization state of the beam output from the electro-optic element 2 is changed. This laser beam having a changed polarization state is again incident on the EOS optical system 6a.

In the EOS optical system 6a, the change of the polarization state of this incident laser beam is converted into a change of light intensity, which is detected by a photodiode and further converted into an electric signal. This electric signal is processed by a signal processing section (not shown), thereby measuring the electric signal applied to the target wiring on the IC wafer 1.

Here, some ICs to be measured are operated by supplying light for excitation from the front or back face side of the substrate, as an optical switch. However, the conventional EOS probe cannot simultaneously perform (i) radiation of such light for excitation from the front or back face side of the IC wafer to be measured, and (ii) measurement of the target electric signal.

SUMMARY OF THE INVENTION

In consideration of the above circumstances, an objective of the present invention is to provide an EOS probe in which light for excitation can be supplied and radiated from either face side. of a target IC wafer, and the target electric signal can also be measured by radiating light (for a sampling operation) from either face side of the IC wafer, without moving the IC wafer.

Therefore, the present invention provides an electro-optic sampling probe comprising:

- an electro-optic element, in contact with a target wiring provided on the front face of an IC wafer to be measured, wherein an electric field is applied via the wiring to the electro-optic element so that the optical characteristics of the electro-optic element are changed;
- an electro-optic sampling optical system module, including a polarized beam splitter, a wave plate, and a photodiode, for:
    - isolating a portion of a laser beam which is emitted from an external device, transmitted through the electro-optic element, and reflected by a face of the electro-optic element, said face facing the wiring, and
    - converting the isolated portion into an electric signal;
- a first probe body, to which an attachment for detachably attaching the electro-optic sampling optical system module is attached, for covering an optical path of light output from the electro-optic sampling optical system module;
- an excitation optical system module for radiating light for excitation towards the IC wafer; and
- a second probe body, to which an attachment for detachably attaching the excitation optical system module is attached, for covering an optical path of light output from the excitation optical system module, and
- wherein the excitation optical system module and the second probe body are provided at the back face side of the IC wafer.

Accordingly, it is possible to measure the electric signal transmitted through the wiring on the wafer of a back-face irradiation type IC.

In the above structure, the excitation optical system module may comprise a half-wave plate, a quarter-wave plate, and a polarizing filter.

Preferably, the attachments for detachably attaching the electro-optic sampling optical system module and the excitation optical system module have the same shape. In this case, the excitation optical system module may be provided at the front face side of the IC wafer while the electro-optic sampling optical system module may be provided at the back face of the IC wafer. Therefore, the measurement direction can be chosen according to the specification of the IC wafer to be measured.

In the electro-optic sampling probe, the light output from the electro-optic sampling optical system module may be used for excitation use. Therefore, when both the front and back faces of the IC wafer have the wiring, it is possible to simultaneously perform the measurements of both faces by substituting the excitation optical system module with another electro-optic sampling optical system module.

Preferably, the direction of the optical axis of the light output from the electro-optic sampling optical system module is adjustable using the attachment which is attached to the electro-optic sampling optical system module.

Also preferably, the direction of the optical axis of the light output from the excitation optical system module is adjustable using the attachment which is attached to the excitation optical system module.

Typically, a fine adjustment stage is provided at each attachment. Accordingly, even if the optical axis is shifted or deviated when the relevant optical system is attached, the optical axis can be adjusted again, thereby reliably performing the measurement.

The present invention also provides a measuring method using an electro-optic sampling probe as described above, wherein the substrate of the IC wafer is an electro-optic crystal. The method comprises the step of directly irradiating the target face of the substrate, without irradiating it via the electro-optic element, so as to measure an electric signal transmitted through the wiring on the face.

In addition, the present invention provides a measuring method which also uses an electro-optic sampling probe as described above, comprising the steps of:

- radiating light for excitation by using the excitation optical system module towards one of the faces of the IC wafer to be measured; and
- measuring an electric signal transmitted through the wiring on the other face of the IC wafer by using the electro-optic sampling optical system module.

DESCRIPTION OF THE PREFERRED EMBODIMENTS

Hereinafter, the EOS (electro-optic sampling) probe as an embodiment according to the present invention will be explained in detail with reference to the drawings.

Figure 1:
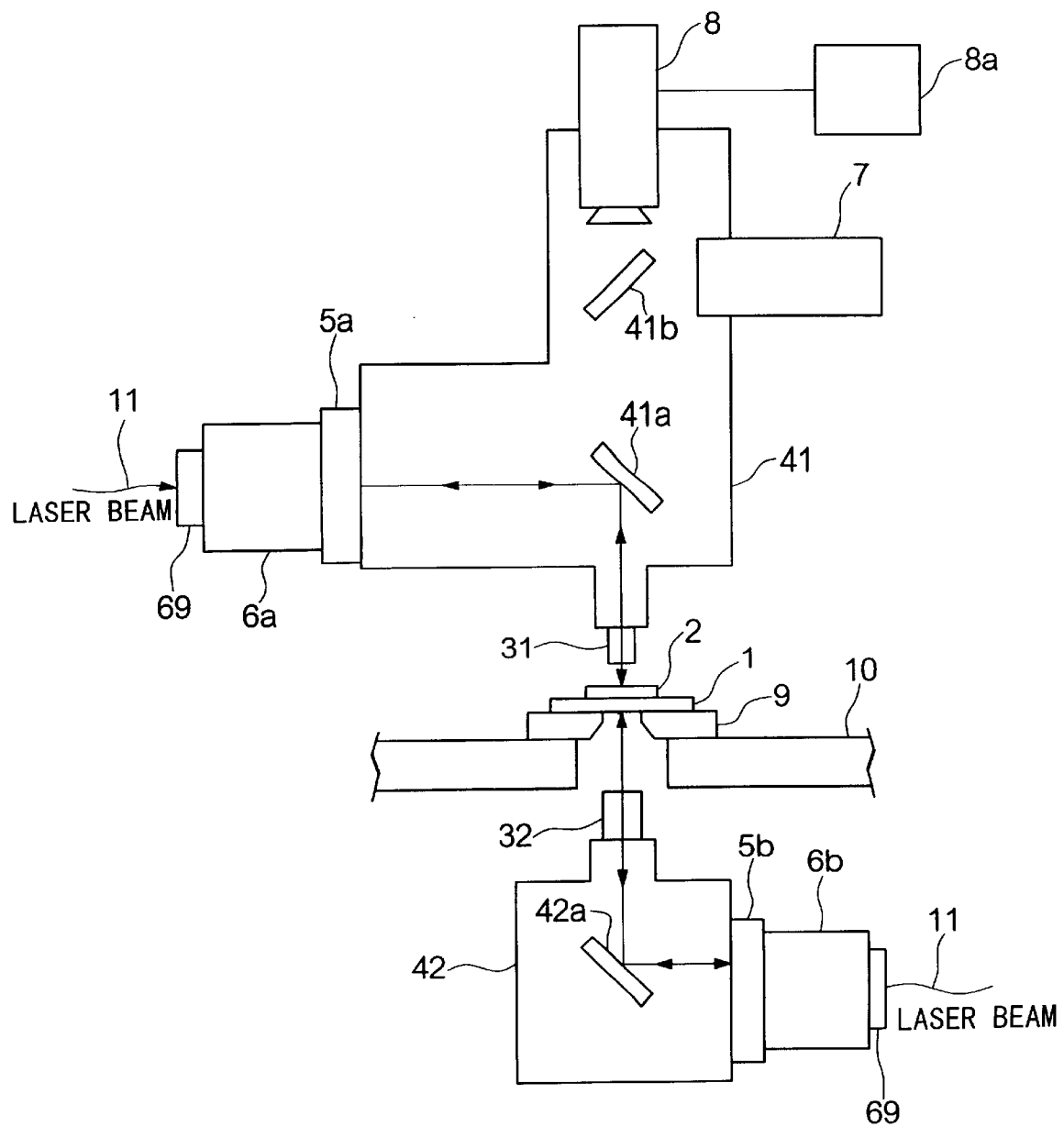
FIG. 1 is a diagram showing the structure of the electro-optic sampling (EOS) probe as an embodiment according to the present invention.
Figure 4:
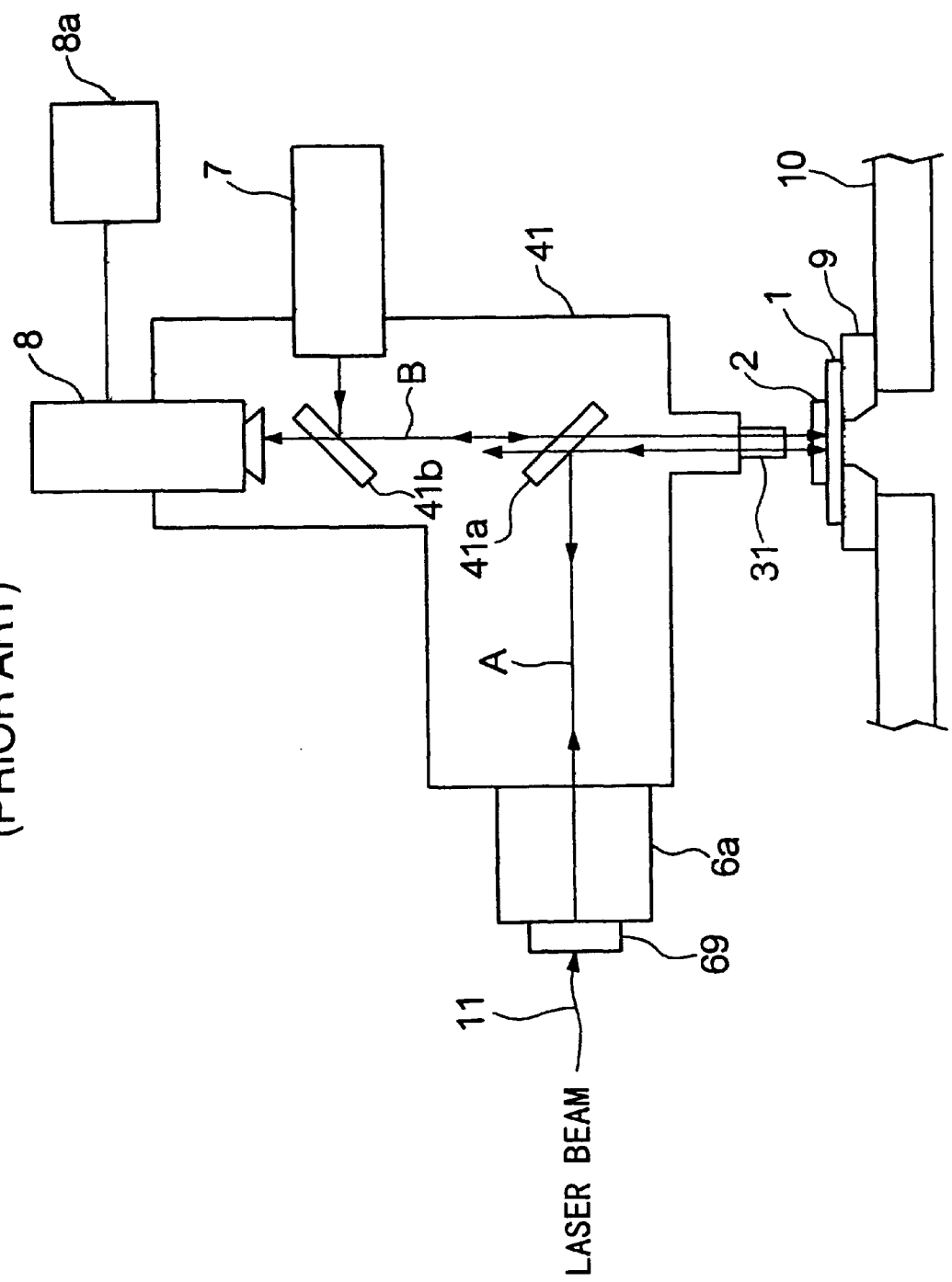
FIG. 4 is a diagram showing the structure of a conventional electro-optic sampling probe.

FIG. 1 is a diagram showing the structure of the present embodiment. In FIG. 1, the parts identical to those in FIG. 4 are given identical reference numerals, and explanations thereof are omitted. The differences between the probe shown in FIG. 1 and the conventional structure are (i) providing an optical system module for excitation (called "excitation optical system", hereinbelow) 6b below the surface plate 10, (ii) further comprising probe body 42, and (iii) fixing the EOS optical system 6a and excitation optical system 6b to probe bodies 41 and 42 by using attachments 5a and 5b.

The EOS optical system 6a and excitation optical system 6b are detachably attached to probe bodies 41 and 42 via attachments 5a and 5b which are provided at the probe bodies 41 and 42.

These two attachments 5a and 5b have the same shape; thus, the EOS optical system 6a can also be attached to attachment 5b and the excitation optical system 6b can also be attached to attachment 5a.

In addition, a fine adjustment stage may be provided between the attachment 5a and probe body 41 so as to adjust the optical axis of the light beam output from the EOS optical system 6a attached to the attachment 5a. Similarly, a fine adjustment stage may be provided between the attachment 5b and probe body 42 so as to adjust the optical axis of the light beam output from the excitation optical system 6b attached to the attachment 5b. The fine adjustment stage which may be used here has two kinds of fine adjustment stages combined with each other, one for adjusting the angle by adjusting the optical axis in the horizontal and vertical directions, and the other for parallel-shifting the optical axis in the horizontal and vertical directions.

Figure 2:
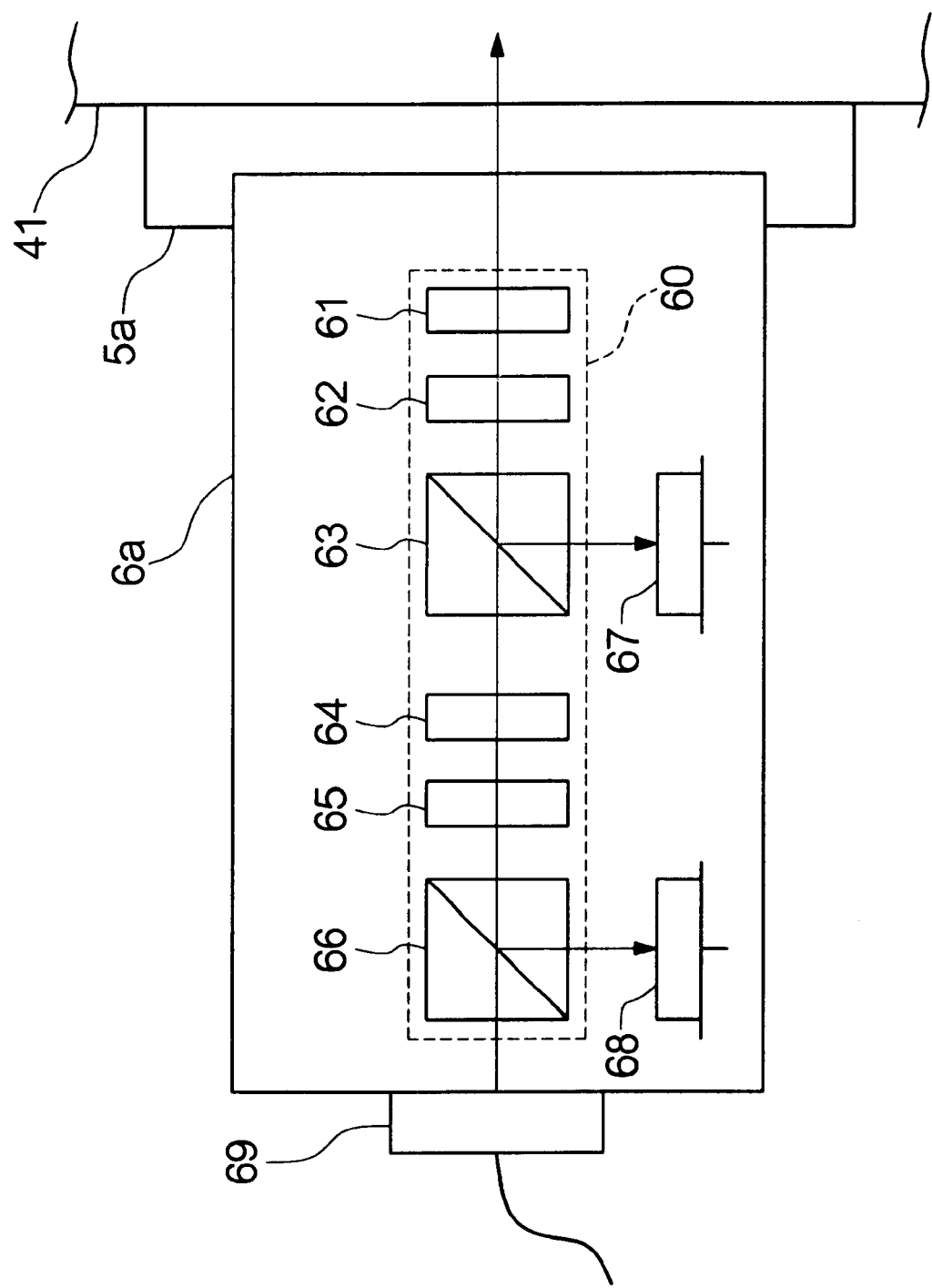
FIG. 2 is a diagram showing the structure of the EOS optical system 6a shown in FIG. 1.

FIG. 2 is a diagram showing the structure of the EOS optical system 6a in detail.

In FIG. 2, reference numerals 61 and 64 indicate half-wave plates, and reference numeral 62 indicates a quarter-wave plate. Reference numerals 63 and 66 indicate polarized beam splitters, and reference numeral 65 indicates a Faraday element. The optical system consisting of the half-wave plates 61 and 64, quarter-wave plate 62, polarized beam splitters 63 and 66, and Faraday element 65 is called the optical isolator 60. Reference numerals 67 and 68 indicate photodiodes.

Figure 3:
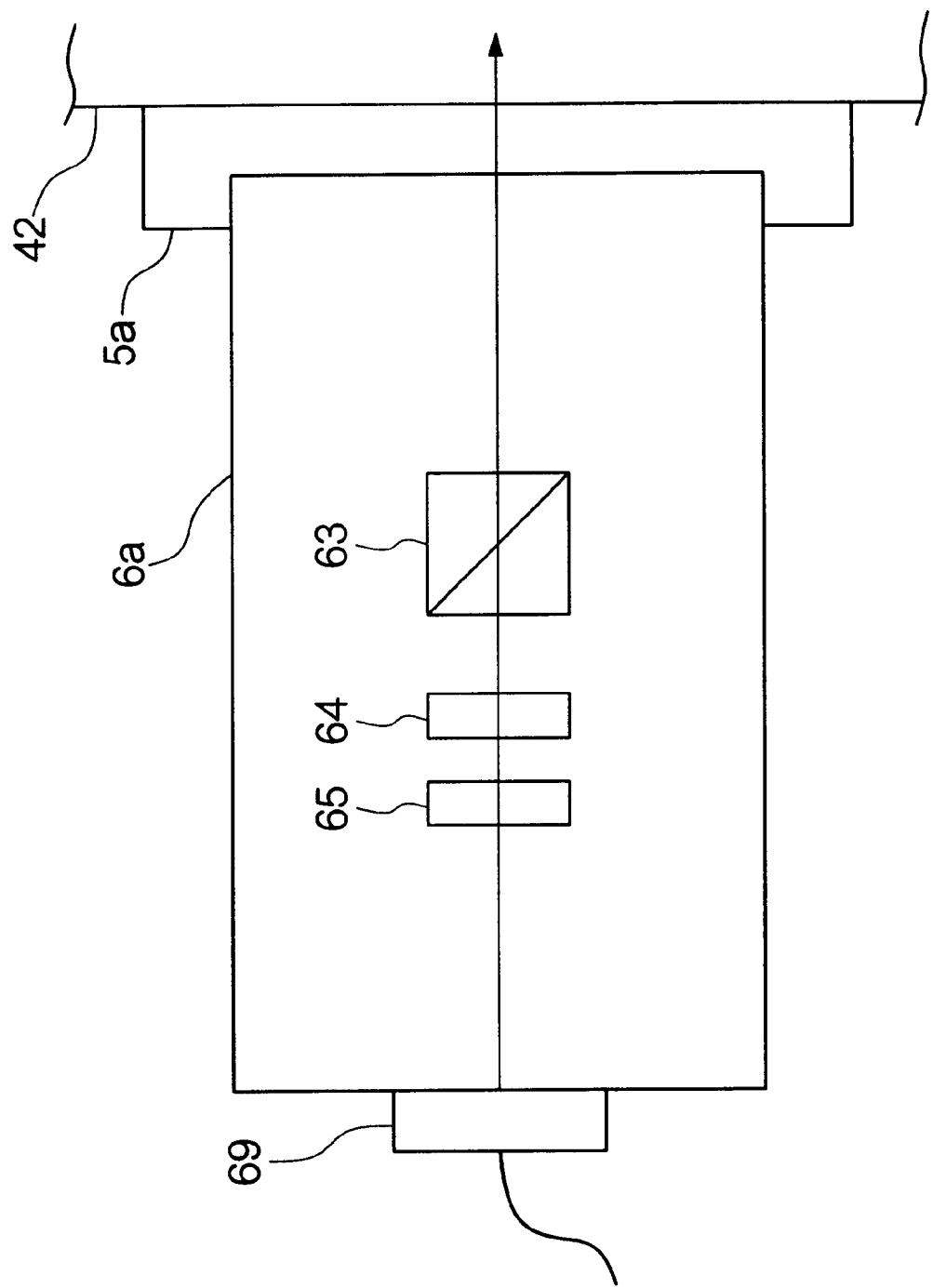
FIG. 3 is a diagram showing the structure of the excitation optical system 6b shown in FIG. 1.

FIG. 3 is a diagram showing the structure of excitation optical system 6b in FIG. 1. This excitation optical system 6b has the same shape as the EOS optical system 6a, but comprises only half-wave plate 64, quarter-wave plate 65, and polarized beam splitter 63 as internal optical components. The polarized beam splitter 63 provided in the excitation optical system 6b may be substituted with a polarizing filter.

Hereinbelow, the operation of measuring a target signal to be measured with respect to the wiring on the IC wafer 1 will be explained with reference to FIGS. 1 to 3. Here, a light beam for excitation is radiated from the back face side of the IC wafer 1 and the electric signal in the front face is measured.

First, the operation of radiating a light beam for excitation towards the back face of the IC wafer 1 by using the excitation optical system 6b will be explained.

First, a laser beam is supplied via optical fiber 11 to the excitation optical system 6b from an external device. This laser beam is collimated by fiber collimator is 69.

This collimated beam is deflected by 90 degrees by dichroic mirror 42a in the probe body 42, and then converged by objective 32 onto the back face of the IC wafer 1. In this way, it is possible to operate or drive a target IC (to be measured) which needs light supply (for excitation) from the back face side.

Here, the dichroic mirror 42a in the probe body 42 may be substituted with a total reflection mirror.

The quantity of light incident from the excitation optical system 6b may be adjusted by rotating the half-wave plate 64 and quarter-wave plate 65.

Next, the operation of measuring the electric signal of the target wiring on the IC wafer 1 will be explained.

A laser beam is supplied via optical fiber 11 to the EOS optical system 6a. This laser beam is collimated by fiber collimator 69.

This collimated beam is deflected by 90 degrees by the dichroic mirror 41a in the probe body 41, and then converged by the objective 31. The converged laser beam is transmitted through the electro-optic element 2 towards the target face (which faces the wiring of the IC wafer 1) of the electro-optic element 2.

In the above process, an electric field generated by the voltage applied to the wiring is applied to the electro-optic element 2, so that in the electro-optic element 2, the refractive index is changed due to the Pockels effect. Accordingly, when the laser beam incident on the electro-optic element 2 is transmitted through the electro-optic element 2, the polarization state of the beam is changed. This laser beam having the changed polarization state is then reflected by the mirror face of the electro-optic element 2 on the wiring of the IC wafer 1, and returned via the same optical path as that of the inputting process and incident on the EOS optical system 6a. Some portions of this laser beam are isolated by isolator 60 as shown in FIG. 2, and they are incident on photodiodes 67 and 68 and converted into electric signals.

The change of the polarization state, due to the electro-optic element 2 according to the variation of the voltage of the target portion to be measured (i.e., the target wiring on the IC wafer 1), corresponds to the difference between the outputs from the photodiodes 67 and 68. The electric signal transmitted through the wiring on the IC wafer 1 can be measured by detecting this output difference.

As explained above, the light for excitation can be radiated from the back face side of the IC, and simultaneously the electric signal of the wiring on the front face of the IC can be measured, that is, even an IC of the back-face irradiation type can be measured.

Instead of excitation optical system 6b, the EOS optical system 6a can also be used for radiating light for excitation. In this case, a laser beam is radiated from the EOS optical system 6a (as in the measurement of the electric signal), and this laser beam is converged onto the back face of the IC wafer 1. In this process, the outputs from the photodiodes 67 and 68 are not processed.

If the substrate of the IC wafer 1 is an electro-optic crystal such as GaAsInP, the measurement can be performed in the following arrangement: that is, the EOS optical system 6a is attached to the probe body 42 which is arranged at the back side of the IC wafer 1 and a laser beam is directly converged onto the back face (observed from the probe body 42 side) of the IC wafer 1. In this way, the measurement with respect to the back face of the IC wafer 1 is also possible. Therefore, even if both the front and back faces of the target IC wafer have wiring patterns, the electric signals of each wiring can be simultaneously measured.

What is claimed is:

1. An electro-optic sampling probe comprising:
   an electro-optic element which is made to contact a target wiring on a face of an IC wafer when a voltage applied to the wiring is measured, wherein the optical characteristics of the electro-optic element change according to a variation of an electric field generated by a variation of the voltage applied to the wiring;
   an electro-optic sampling optical system module, including a polarized beam splitter, a wave plate, and a photodiode, for:
      isolating a portion of a laser beam which is emitted from an external device, transmitted through the electro-optic element, and reflected by a face of the electro-optic element, said face facing the wiring, and
      converting the isolated portion into an electric signal;
   a first probe body, to which an attachment for detachably attaching the electro-optic sampling optical system module is attached, for covering an optical path of light output from the electro-optic sampling optical system module;
   an excitation optical system module for radiating light for excitation towards the IC wafer; and
   a second probe body, to which an attachment for detachably attaching the excitation optical system module is attached, for covering an optical path of light output from the excitation optical system module, and
   wherein the excitation optical system module and the second probe body are provided at the other face side of the IC wafer.

2. An electro-optic sampling probe as claimed in claim 1, wherein the excitation optical system module comprises a half-wave plate, a quarter-wave plate, and a polarizing filter.

3. An electro-optic sampling probe as claimed in claim 1, wherein the attachments for detachably attaching the electro-optic sampling optical system module and the excitation optical system module have the same shape.

4. An electro-optic sampling probe as claimed in claim 2, wherein the attachments for detachably attaching the electro-optic sampling optical system module and the excitation optical system module have the same shape.

5. An electro-optic sampling probe as claimed in claim 1, wherein the excitation optical system module has the same internal structure as that of the electro-optic sampling optical system module.

6. An electro-optic sampling probe as claimed in claim 1, wherein the direction of the optical axis of the light output from the electro-optic sampling optical system module is adjustable using the attachment which is attached to the electro-optic sampling optical system module.

7. An electro-optic sampling probe as claimed in claim 1, wherein the direction of the optical axis of the light output from the excitation optical system module is adjustable using the attachment which is attached to the excitation optical system module.

8. An electro-optic sampling probe as claimed in claim 4, wherein the direction of the optical axis of the light output from the electro-optic sampling optical system module is adjustable using the attachment which is attached to the electro-optic sampling optical system module.

9. An electro-optic sampling probe as claimed in claim 4, wherein the direction of the optical axis of the light output from. the excitation optical system module is adjustable using the attachment which is attached to the excitation optical system module.

10. A measuring method using an electro-optic sampling probe, comprising the steps of:
    detachably attaching an electro-optic sampling optical system module to a first probe body;
    detachably attaching an excitation optical system module to a second probe body;
    radiating light for excitation by using the excitation optical system module towards an IC wafer which has a face side including a target wiring, in a manner such that the other face side of the IC wafer receives the light from the excitation optical system module; and
    measuring an electric signal transmitted through the wiring by using the electro-optic sampling optical system module.

* * * * *